United States Patent
Jung

(10) Patent No.: US 11,508,448 B2
(45) Date of Patent: Nov. 22, 2022

(54) MEMORY SYSTEM INCLUDING MEMORY DEVICE AND OPERATING METHOD THEREOF

(71) Applicant: SK hynix Inc., Gyeonggi-do (KR)

(72) Inventor: Won Jin Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 22 days.

(21) Appl. No.: 17/244,309

(22) Filed: Apr. 29, 2021

(65) Prior Publication Data

US 2022/0165343 A1 May 26, 2022

(30) Foreign Application Priority Data

Nov. 25, 2020 (KR) .......... 10-2020-0159710

(51) Int. Cl.
| | |
|---|---|
| G11C 11/00 | (2006.01) |
| G11C 16/34 | (2006.01) |
| G11C 16/26 | (2006.01) |
| G11C 16/10 | (2006.01) |

(52) U.S. Cl.
CPC ........ G11C 16/3459 (2013.01); G11C 16/102 (2013.01); G11C 16/26 (2013.01)

(58) Field of Classification Search
CPC .... G11C 16/3459; G11C 16/102; G11C 16/26
See application file for complete search history.

(56) References Cited

U.S. PATENT DOCUMENTS

| | | | |
|---|---|---|---|
| 7,099,196 B2 * | 8/2006 | Suh ................ | G11C 16/3454 365/185.23 |
| 9,941,014 B2 * | 4/2018 | Lee ................ | G11C 16/10 |
| 10,109,355 B2 * | 10/2018 | Nagao ............. | G11C 11/5628 |

FOREIGN PATENT DOCUMENTS

| | | |
|---|---|---|
| KR | 10-2018-0110708 | 10/2018 |
| KR | 10-2083547 | 3/2020 |

* cited by examiner

*Primary Examiner* — Pho M Luu
(74) *Attorney, Agent, or Firm* — IP & T Group LLP

(57) ABSTRACT

A memory system including a memory device suitable for performing, in stages, a program loop including a program operation and a program verification operation on each page within a memory block selected among a plurality of memory blocks, updating a maximum number of program loops for the selected memory block by comparing a number of program loops on each page, which are performed until the program verification operation is processed as a pass on the page, with a current maximum number of program loops for the selected memory block, and storing the updated maximum number of program loops for the selected memory block as program pass information of the selected memory block; and a controller suitable for managing the selected memory block as a bad block based on the program pass information of the selected memory block.

20 Claims, 4 Drawing Sheets

MEMORY SYSTEM INCLUDING MEMORY DEVICE AND OPERATING METHOD THEREOF

CROSS-REFERENCE TO RELATED APPLICATION(S)

The present application claims priority under 35 U.S.C. § 119(a) to Korean Patent Application No. 10-2020-0159710, filed on Nov. 25, 2020, the disclosure of which is incorporated herein by reference in its entirety.

BACKGROUND

1. Field

Various embodiments of the present disclosure generally relate to a memory device. More particularly, the embodiments relate to a memory device that manages a bad block based on the number of program loops, and a memory system including the memory device.

2. Description of the Related Art

The computer environment paradigm has moved towards ubiquitous computing, which enables computing systems to be used virtually anytime and anywhere. As a result, the demand for portable electronic devices, such as mobile phones, digital cameras, and laptop computers has increased rapidly. Those electronic devices generally include a memory system using a memory device as a data storage device. The data storage device may be used as a main memory unit or an auxiliary memory unit of a portable electronic device.

Since there is no mechanical driving part, such a data storage device provides advantages such as excellent stability and durability, high information access speed, and low power consumption. Also, the data storage device can have a quick data access rate with low power consumption relative to a hard disk device. Examples of data storage devices having such advantages include universal serial bus (USB) memory devices, memory cards of diverse interfaces, solid-state drives (SSDs), and the like.

SUMMARY

Various embodiments of the present disclosure are directed to a memory device capable of preventing occurrence of program failure by updating a maximum number of program loops performed in stages thereon and managing a bad block based on the updated maximum number of program loops, and a memory system including the memory device.

In accordance with an embodiment of the present disclosure, a memory system may include: a memory device suitable for: performing, in stages, a program loop including a program operation and a program verification operation on each page within a memory block selected among a plurality of memory blocks, updating a maximum number of program loops for the selected memory block by comparing a number of program loops on each page, which are performed until the program verification operation is processed as a pass on the page, with a current maximum number of program loops for the selected memory block, and storing the updated maximum number of program loops for the selected memory block as program pass information of the selected memory block; and a controller suitable for managing the selected memory block as a bad block based on the program pass information of the selected memory block.

In accordance with an embodiment of the present disclosure, a memory system may include: a controller; a memory device comprising: at least one memory block including a plurality of pages; a check circuit suitable for verifying a program pass or program failure of a page selected among the plurality of pages, and outputting a pass signal and a failure signal; an update circuit suitable for updating a maximum count value of the memory block by increasing a count value of the selected page in response to the failure signal and comparing the count value of the selected page with a current maximum count value of the memory block; and a storage circuit suitable for storing the updated maximum count value of the memory block as program pass information of the memory block.

In accordance with an embodiment of the present disclosure, an operating method of a memory system may include: programming a page selected among a plurality of pages included in at least one memory block and verifying a program pass or program failure of the selected page; updating a maximum count value of the memory block by increasing a count value of the selected page based on the verification result and comparing the count value of the selected page with a current maximum count value of the memory block; and managing the memory block as a bad block based on the updated maximum count value of the memory block.

In accordance with an embodiment of the present disclosure, a memory system may include: a memory device suitable for performing one or more program loops on each page within a target memory block according to an incremental step pulse program (ISPP) scheme; and a controller suitable for processing the target memory block as a bad block: when a number of program loops on a page within the target memory block is greater than a first threshold, and when a maximum one among numbers of program loops on individual ones of all pages within the target memory block is greater than a second threshold, wherein the first threshold is greater than the second threshold, and wherein the number of program loops on a page is a number of program loops on the page until a last one among the program loops is successful on the page.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure. However, the present disclosure is not limited to the embodiments disclosed below, but may be implemented in various other forms. The disclosed embodiments are provided to make the present disclosure complete and to enable those skilled in the art to practice the invention.

Figure 1:
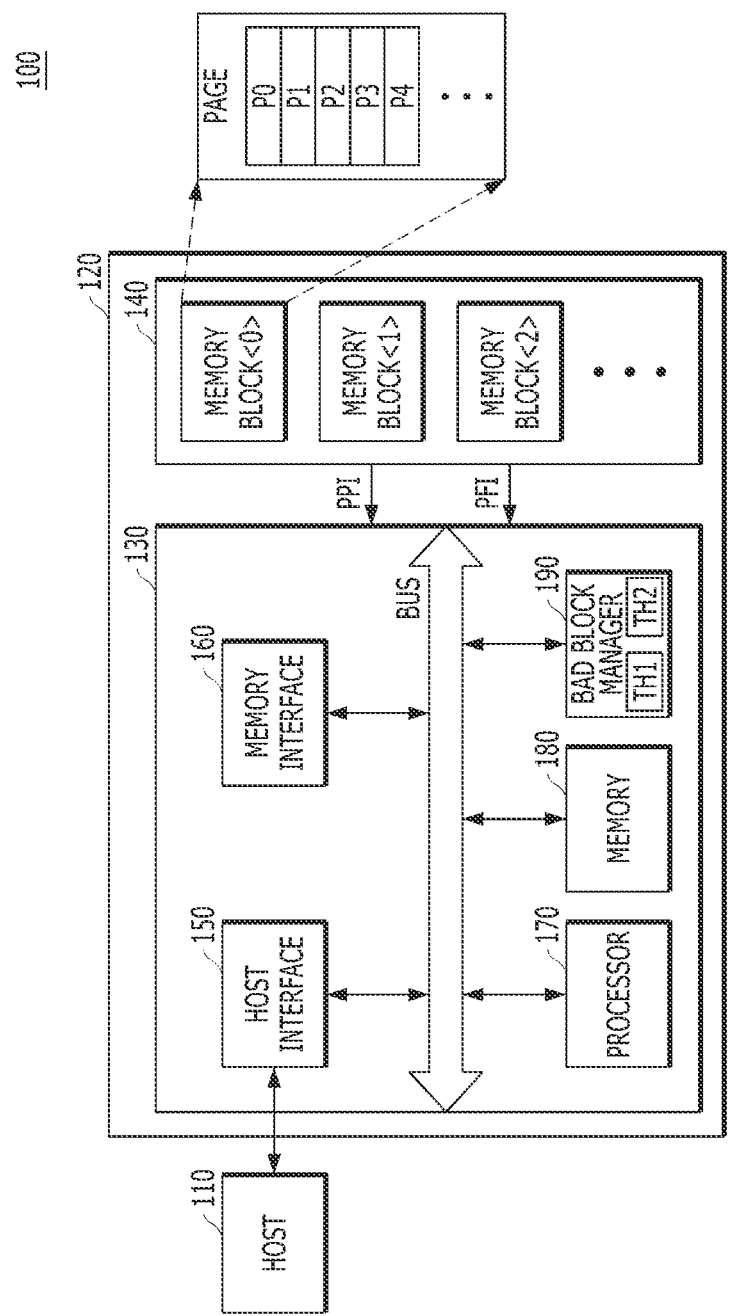
FIG. 1 is a block diagram illustrating a data processing system including a memory system in accordance with an embodiment of the present disclosure.

FIG. 1 is a block diagram illustrating a data processing system 100 including a memory system 120 in accordance with an embodiment of the present disclosure. Referring to FIG. 1, the data processing system 100 may include a host 110 and the memory system 120.

The host 110 may include, for example, a portable electronic device such as a mobile phone, an MP3 player and a laptop computer, or an electronic device such as a desktop computer, a game player, a television (TV), a projector and the like.

The host 110 also includes at least one operating system (OS), which can generally manage and control, functions and operations performed in the host 110. The OS can provide interoperability between the host 110 engaged with the memory system 120 and a user needing and using the memory system 120. The OS may support functions and operations corresponding to a user's requests. By way of example but not limitation, the OS can be classified into a general operating system and a mobile operating system according to mobility of the host 110. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix and the like. Further, the mobile operating system may include an Android, an iOS, a Windows mobile and the like. The mobile operating system may be subject to support services or functions for mobility (e.g., a power saving function). The host 110 may include a plurality of operating systems. The host 110 may execute multiple operating systems interlocked with the memory system 120, corresponding to a user's request. The host 110 may transmit a plurality of commands corresponding to the user's requests into the memory system 120, thereby performing operations corresponding to commands within the memory system 120. Handling plural commands in the memory system 120 is described later, in reference to FIGS. 4 and 5.

The memory system 120 may operate or perform a specific function or operation in response to a request from the host 110 and, particularly, may store data to be accessed by the host 110. The memory system 120 may be used as a main memory system or an auxiliary memory system of the host 110. The memory system 120 may be implemented with any of various types of storage devices, which may be electrically coupled with the host 110, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The memory system 120 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The storage devices for the memory system 120 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 120 may include a controller 130 and a memory device 140. The memory device 140 may store data to be accessed by the host 110. The controller 130 may control storage of data in the memory device 140.

The controller 130 may control overall operations of the memory device 140, such as read, write, program and erase operations. For example, the controller 130 may control the memory device 140 in response to a request from the host 110. The controller 130 may provide the data, read from the memory device 140, to the host 110. The controller 130 may store the data, provided by the host 110, into the memory device 140.

In an embodiment, the controller 130 may include a host interface 150, a memory interface 160, a processor 170, a memory 180 and a bad block manager 190. All the configurations 150, 160, 170, 180 and 190 included in the controller 130 may share a signal transmitted in the inside of the controller 130 through an internal bus BUS.

The host interface 150 may interface the host 110 and the memory system 120 in response to the protocol of the host 110. The host interface 150 may perform an operation of exchanging commands and data transmitted between the host 110 and the memory system 120.

The host interface 150 may process commands and data provided from the host 110, and may communicate with the host 110 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 150 may exchange data with the host 110, which may be implemented through a firmware called a host interface layer (HIL).

The memory interface 160 may serve as an interface for handling commands and data transferred between the controller 130 and the memory device 140, to allow the controller 130 to control the memory device 140 in response to a request delivered from the host 110. The memory interface 160 may generate a control signal for the memory device 140 and may process data entered into or outputted from the memory device 140 under the control of the processor 170 in a case when the memory device 140 is a flash memory and, in particular, when the memory device 140 is a NAND flash memory. The memory interface 160 can provide an interface for handling commands and data between the controller 130 and the memory device 140, for example, operations of NAND flash interface, in particular, operations between the controller 130 and the memory device 140. In accordance with an embodiment, the memory interface 160 can be implemented through firmware called a Flash Interface Layer (FIL) as a component for exchanging data with the memory device 140.

The processor 170 may be implemented with a microprocessor or a central processing unit (CPU). The memory system 120 may include one or more processors 170. The processor 170 may control the overall operations of the memory system 120. By way of example but not limitation, the processor 170 can control a program operation or a read operation of the memory device 140, in response to a write request or a read request entered from the host 110. In accordance with an embodiment, the processor 170 may use or execute firmware to control the overall operations of the memory system 120. Herein, the firmware may be referred to as a flash translation layer (FTL). The FTL may perform an operation as an interface between the host 110 and the memory device 140. The host 110 may transmit requests for write and read operations to the memory device 140 through the FTL.

For example, when performing an operation requested from the host 110 in the memory device 140, the controller 130 uses the processor 170 implemented in a microprocessor or central processing unit (CPU) or the like. The processor 170 engaged with the memory device 140 can handle instructions or commands corresponding to an inputted command from the host 110. The controller 130 can perform a foreground operation as a command operation, corresponding to a command inputted from the host 110, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 140 through the processor 170. By way of example but not limitation, the background operation for the memory device 140 includes a garbage collection (GC) operation, a wear leveling (WL) operation, a map flush operation and a bad block management operation of checking or searching for bad blocks.

The garbage collection operation may include an operation of copying and processing data, which are stored in a random memory block among memory blocks MEMORY BLOCK<0, 1, 2, . . . > of the memory device 140, into another random memory block. The wear leveling operation may include an operation of swapping and processing stored data between the memory blocks MEMORY BLOCK<0, 1, 2, . . . > of the memory device 140. The map flush operation may include an operation of storing map data, stored in the controller 130, in the memory blocks MEMORY BLOCK<0, 1, 2, . . . > of the memory device 140. The bad block management operation may include an operation of checking and processing a bad block among the memory blocks MEMORY BLOCK<0, 1, 2, . . . > of the memory device 140.

The controller 130 may generate and manage log data through the processor 170 implemented as a microprocessor or a central processing unit (CPU) in response to an operation of accessing the memory blocks MEMORY BLOCK<0, 1, 2, . . . > of the memory device 140. The operation of accessing the memory blocks MEMORY BLOCK<0, 1, 2, . . . > of the memory device 140 may include a foreground operation or a background operation performed on the memory blocks MEMORY BLOCK<0, 1, 2, . . . > of the memory device 140.

The memory 180, which is a working memory of the memory system 120 and the controller 130, may store data for driving the memory system 120 and the controller 130. More specifically, when the controller 130 controls the memory device 140 in response to a request of the host 110, the memory 180 may store firmware driven by the processor 170 and data required for driving the firmware, for example, metadata.

In addition, the memory 180, which is a buffer memory of the memory system 120 and the controller 130, may temporarily store write data transmitted from the host 110 to the memory device 140 and read data transmitted from the memory device 140 to the host 110. The memory 180 may include a program memory, a data memory, a write buffer/cache, a read buffer/cache, a data buffer/cache and a map buffer/cache, for storing the write and read data.

The memory 180 may be implemented with a volatile memory. The memory 180 may be implemented with a static random access memory (SRAM), a dynamic random access memory (DRAM) or both.

Figure 2:
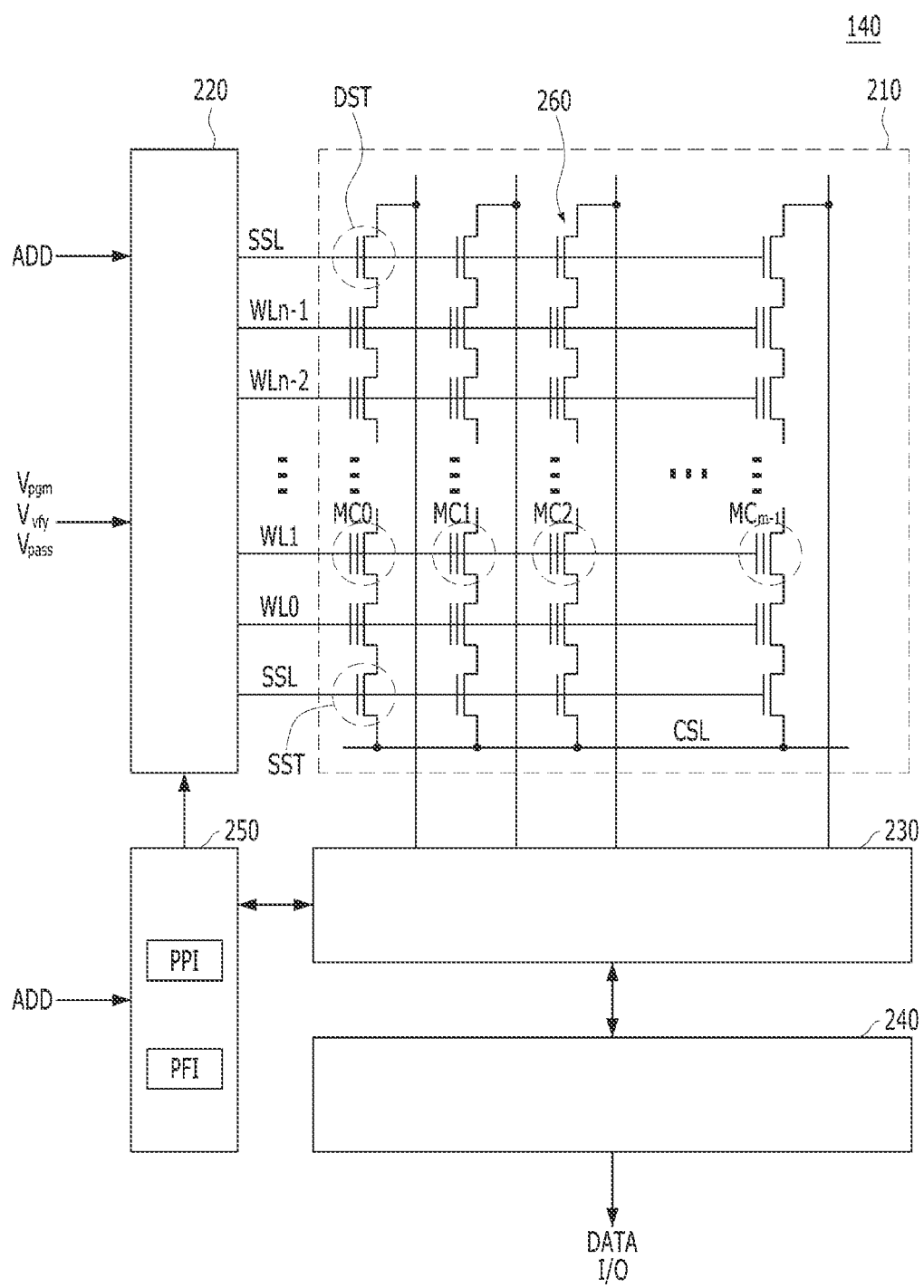
FIG. 2 is a block diagram illustrating a memory device illustrated in FIG. 1.

Although FIG. 2 illustrates that the memory 180 is included in the controller 130, the present disclosure is not limited thereto. The memory 180 may be included outside the controller 130, and the controller 130 may input and output data to the memory 180 through a separate memory interface (not illustrated).

The bad block manager 190 may perform a bad block management operation on the memory device 140. According to an embodiment, the controller 130 may request program pass information PPI and program failure information PFI from the memory device 140. The bad block manager 190 may check and process a bad block among memory blocks MEMORY BLOCK<0, 1, 2, . . . > of the memory device 140 based on the program pass information PPI and the program failure information PFI.

The program failure information PFI may represent a target memory block within which a number of program loops on a page is equal to or greater than a first threshold value TH1. The bad block manager 190 may designate, as a bad block, the target memory block, within which a number of program loops is equal to or greater than the first threshold value TH1, based on the program failure information PFI.

The program pass information PPI may represent a maximum number of program loops of the target memory block. The bad block manager 190 may compare the maximum number of program loops with a second threshold value TH2 that is smaller than the first threshold value TH1 by a predetermined size. When the comparison result indicates that the maximum number of program loops is equal to or greater than the second threshold value TH2, the bad block manager 190 may designate the target memory block as a bad block.

The memory device 150 may operate as a storage medium of the memory system 120.

The memory device 150 may be a nonvolatile memory device and may retain data stored therein even while an electrical power is not supplied. The memory device 150 may store data provided from the host 110 through a write operation, while providing data stored therein to the host 110 through a read operation.

In an embodiment of the present disclosure, the memory device 150 is embodied as a nonvolatile memory such as a flash memory such as a NAND flash memory, a NOR flash memory and the like. Alternatively, the memory device 150 may be implemented by at least one of a phase change random access memory (PCRAM), a ferroelectrics random access memory (FRAM), a spin injection magnetic memory (STT-RAM), and a spin transfer torque magnetic random access memory (STT-MRAM), or the like.

The memory device 150 may include the plurality of memory blocks MEMORY BLOCK<0, 1, 2, . . . >. Each of the memory blocks MEMORY BLOCK<0, 1, 2, . . . > included in the memory device 150 may include a plurality of pages P<0, 1, 2, 3, 4, . . . >. Furthermore, although not specifically illustrated in the drawings, each of the pages P<0, 1, 2, 3, 4, . . . > may include a plurality of memory cells.

Each of the memory blocks MEMORY BLOCK<0, 1, 2, . . . > included in the memory device 150 may be classified into a single-level cell (SLC) memory block and a multi-level cell (MLC) memory block depending on the number of bits that can be stored or represented in a single memory cell included therein.

The memory device 150 can include a plurality of memory blocks. The plurality of memory blocks can be any of different types of memory blocks such as a single-level cell (SLC) memory block, a multi-level cell (MLC) memory block or the like, according to the number of bits that can be stored or represented in one memory cell. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have larger storage capacity for the same space compared to the SLC memory block. The MLC memory block can be highly integrated in a view of storage capacity. In an embodiment, the memory device 150 may be implemented with MLC memory blocks such as an MLC memory block, a triple-level cell (TLC) memory block, a quadruple-level cell (QLC) memory block and a combination thereof. The MLC memory block may include a plurality of pages implemented by memory cells, each capable of storing 2-bit data. The triple-level cell (TLC) memory block can include a plurality of pages implemented by memory cells, each capable of storing 3-bit data. The quadruple-level cell (QLC) memory block can include a plurality of pages implemented by memory cells, each capable of storing 4-bit data. In another embodiment, the memory device 150 can be implemented with a block including a plurality of pages implemented by memory cells, each capable of storing 5-bit or more bit data.

Hereinafter, an operation of the memory device 140 that generates the program pass information PPI and the program failure information PFI will be described in detail.

FIG. 2 is a block diagram illustrating the memory device 140 illustrated in FIG. 1. FIG. 2 schematically illustrates a memory cell array circuit of the memory blocks MEMORY BLOCK<0, 1, 2, . . . > of the memory device 140 of FIG. 1.

The memory device 140 may include a memory cell array 210, a row decoder 220, a read/write circuit 230, a column decoder 240 and control logic 250. Each of the memory blocks MEMORY BLOCK<0, 1, 2, . . . > may be implemented as the memory cell array 210 in the memory device 140. The memory cell array 210 may include a plurality of cell strings 260 coupled to bit lines BL0, BL1, BL2, . . . and BLm−1, respectively.

Each of the cell strings 260 may include at least one drain selection transistor DST and at least one source selection transistor SST. Each of the bit lines BL0, BL1, BL2, . . . and BLm−1 may be coupled to one end of the drain selection transistor DST. One end of the source selection transistor SST may be coupled to a common source line CSL. A plurality of memory cells MC0, MC1, MC2, . . . and MCm−1 or a plurality of memory cell transistors may be coupled in series between the selection transistors DST and SST. Each of word lines WL0, WL1, . . . , WLn−2 and WLn−1 may be coupled to the memory cells MC0, MC1, MC2, . . . and MCm−1 arranged along a row direction, for example, control gates of the memory cells MC0, MC1, MC2, . . . and MCm−1.

FIG. 2 illustrates, as an example, the memory blocks MEMORY BLOCK<0, 1, 2, . . . > each consisting of NAND flash memory cells. However, the plurality of memory blocks MEMORY BLOCK<0, 1, 2, . . . > included in the memory device 140 according to an embodiment are not limited to a NAND flash memory and may be implemented as, for example, a NOR-type flash memory, a hybrid flash memory in which at least two or more types of memory cells are mixed, a one-NAND flash memory in which a controller is embedded in a memory chip, and so on. In addition, the memory device 140 according to an embodiment may be implemented as a charge trap flash (CTF) memory in which a charge storage layer consists of a dielectric layer as well as a flash memory device in which a charge storage layer consists of a conductive floating gate.

The row decoder 220 may select one of the word lines of a selected memory block based on an address ADD. The row decoder 220 may apply a word line voltage, generated by a voltage supply unit (not illustrated), to the selected word line of the selected memory block. For example, during a program operation, the row decoder 220 may apply a program voltage Vpgm and a verification voltage Vvfy to the selected word line, and apply a pass voltage Vpass to an unselected word line.

The read/write circuit 230 may include a page buffer, and operate as a sense amplifier or a write driver according to an operation mode. For example, during the program operation, the read/write circuit 230 may receive data to be programmed from an external circuit, and transmit a bit line voltage, which corresponds to the received data, to the bit lines BL0, BL1, BL2, . . . and BLm−1 of the memory cell array 210. During a read operation, the read/write circuit 230 may read data, stored in a selected memory cell, through the bit lines BL0, BL1, BL2, . . . and BLm−1, latch the read data, and output the latched data to the outside.

The bit lines BL0, BL1, BL2, . . . and BLm−1 of the memory cell array 210 may be addressed by the column decoder 240. The column decoder 240 may transmit data, received from the outside, to the read/write circuit 230 or output data stored therein to the outside.

The control logic 250 may perform, in stages, program loops each including a program operation and a program verification operation on a target memory block. The control logic 250 may perform the program operation according to an incremental step pulse program (ISPP) scheme, based on which a program voltage applied to a group among the word lines WL0, WL1, . . . , WLn−2 and WLn−1, for example, a target page within the target memory block of the memory cell array 210 increases by a predetermined amount whenever a number of the program loops increases during the program operation on the target page. According to the ISPP method, the control logic 250 may perform the program verification operation of checking whether a threshold voltage of a programmed memory cell reaches a target level, after performing the program operation in each program loop. According to a result of the program verification operation, the control logic 250 may perform another program loop by increasing a level of a program voltage.

The control logic 250 may store, as the program pass information PPI, the maximum number of program loops performed on the target memory block. The control logic 250 may compare the number of program loops performed on a current target page with a current maximum number of program loops stored as the program pass information PPI for target memory block including the current target page, and update the maximum number of program loops for the target memory block to the number of program loops on the current target page when the number of program loops performed on the current target page is greater than the current maximum number of program loops.

According to an embodiment, when the program operation is completely performed on the target memory block, that is, when the program operation is completed on all pages within the target memory block, the control logic 250 may transmit the program pass information PPI to the controller 130. At this time, the program pass information PPI for the target memory block may include the address ADD of the target memory block and the maximum number of program loops corresponding to the target memory block.

In addition, the control logic 250 may store the program failure information PFI representing the target memory block in which the performed program operation fails on a page within the target memory block. As described above, the program failure information PFI may represent the target memory block within which a number of program loops on a page is equal to or greater than the first threshold value TH1. When the program operation on the page fails, that is, when the number of program loops on the page is equal to or greater than the first threshold value TH1 within the target memory block, the control logic 250 may transmit the program failure information PFI for the target memory block to the controller 130.

Figure 3:
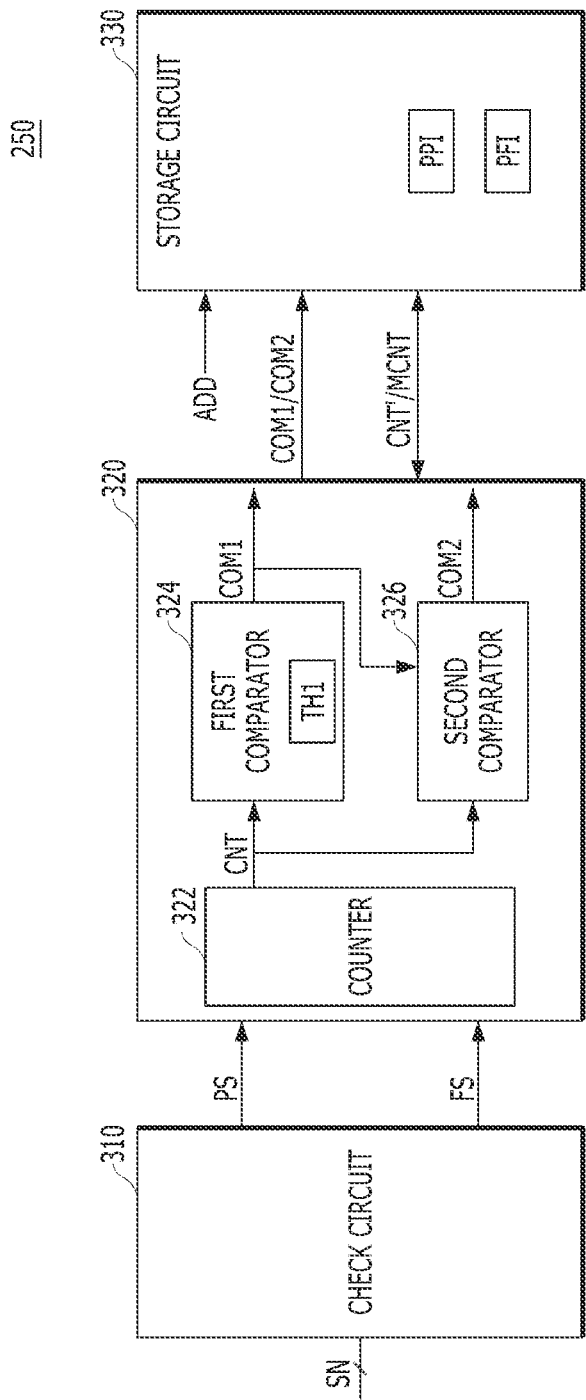
FIG. 3 is a block diagram illustrating control logic illustrated in FIG. 2.

FIG. 3 is a block diagram illustrating the control logic 250 illustrated in FIG. 2. Referring to FIG. 3, the control logic 250 may include a check circuit 310, an update circuit 320 and a storage circuit 330.

The control logic 250 may control the read/write circuit 230 to perform the program verification operation. The read/write circuit 230 may be coupled to the memory cells MC0, MC1, MC2, . . . and MCm−1 of the target page, on which the program operation is performed within the target memory block, through the bit lines BL0, BL1, BL2, . . . and BLm−1, and detect program states of the memory cells MC0, MC1, MC2, . . . and MCm−1 of the target page. The read/write circuit 230 may include a plurality of page buffers corresponding to the bit lines BL0, BL1, BL2, . . . and BLm−1.

During the program verification operation, the plurality of page buffers may store verification data according to the program states of the memory cells MC0, MC1, MC2, . . . and MCm−1 of the target page, and then change potential of corresponding sensing nodes SN to a low level and a high level. For example, when the program states of the memory cells MC0, MC1, MC2, . . . and MCm−1 of the target page are determined as passes, the potential of the sensing nodes SN may maintain the low level, and when the program states of the memory cells MC0, MC1, MC2, . . . and MCm−1 of the target page are determined as failure, the potential of the sensing nodes SN may change to the high level.

The check circuit 310 may verify a program pass or program failure of the memory cells MC0, MC1, MC2, . . . and MCm−1 of the target page, and output a pass signal PS and a failure signal FS for the target page. The check circuit 310 may count the number of memory cells whose program states are determined as pass or failure, among the memory cells MC0, MC1, MC2, . . . and MCm−1 of the target page. The check circuit 310 may compare the counted number of memory cells with a reference value and output the pass signal PS and the failure signal FS for the target page.

For example, the check circuit 310 may perform a counting operation in response to high-level potential of the sensing nodes SN. That is, the check circuit 310 may count the number of sensing nodes SN having the high-level potential and compare the counted number of sensing nodes SN with a reference value. When the counted number is less than the reference value, the check circuit 310 may verify the memory cells MC0, MC1, MC2, . . . and MCm−1 of the target page as the program pass and may output the pass signal PS for the target page. When the counted number is equal to or greater than the reference value, the check circuit 310 may verify the memory cells MC0, MC1, MC2, . . . and MCm−1 of the target page as the program failure and may output the failure signal FS for the target page.

At this time, the control logic 250 may determine whether to terminate or continue the program loop of the program operation on the target page, according to the program verification result of the check circuit 310. When the check circuit 310 outputs the pass signal PS for the target page, the control logic 250 may terminate the program loop on the memory cells MC0, MC1, MC2, . . . and MCm−1 of the target page. On the other hand, when the check circuit 310 outputs the failure signal FS for the target page, the control logic 250 may perform a control to perform another program loop on the target page by increasing the level of the program voltage.

Whenever the number of the program loops on the target page increases, the update circuit 320 may increase a count value CNT for the target page and update the program pass information PPI for the target memory block including the target page. The update circuit 320 may increase the count value CNT for the target page in response to the failure signal FS for the target page and may update a maximum count value CNT' for the target memory block by comparing the increased count value CNT for the target page with a current maximum count value MCNT for the target memory block including the target page. The storage circuit 330 may store the updated maximum count value CNT' for the target memory block as the program pass information PPI for the target memory block.

The update circuit 320 may include a counter 322, a first comparator 324 and a second comparator 326. The counter 322 may perform a counting operation in response to the failure signal FS for the target page. That is, whenever the check circuit 310 outputs the failure signal FS for the target page, the counter 322 may increase the count value CNT for the target page.

The first comparator 324 may compare the count value CNT for the target page with the first threshold value TH1 in response to the pass signal PS for the target page and output a first comparison signal COM1 for the target memory block including the target page. When the pass signal PS for the target page is activated and the count value CNT for the target page is equal to or greater than the first threshold value TH1, the first comparator 324 may activate the first comparison signal COM1 for the target memory block.

The second comparator 326 may compare the count value CNT for the target page with the current maximum count value MCNT for the target memory block including the target page in response to the pass signal PS for the target page and the first comparison signal COM1 for the target memory block and may output a second comparison signal COM2 for the target memory block. When the pass signal PS for the target page is activated and the count value CNT for the target page is less than the first threshold value TH1, the second comparator 326 may compare the count value CNT for the target page with the current maximum count value MCNT for the target memory block. When the comparison result indicates that the count value CNT for the target page is equal to or greater than the current maximum count value MCNT for the target memory block, the second comparator 326 may activate the second comparison signal COM2 for the target memory block.

At this time, the storage circuit 330 may store the input address ADD of the target memory block and the maximum count value CNT' for the target memory block as the program pass information PPI for the target memory block in response to the second comparison signal COM2 for the target memory block. The maximum count value CNT' for the target memory block may represent the count value CNT of the target page, which is equal to or greater than the current maximum count value MCNT for the target memory block including the target page. The maximum count value CNT' corresponding to a current program operation on the target memory block may be provided, as the current maximum count value MCNT for the target memory block, to the update circuit 320 when a subsequent program operation is performed on the target memory block. The storage circuit 330 may provide the update circuit 320 with the maximum count value CNT' corresponding to a current program operation on the target memory block as the current maximum count value MCNT for the target memory block based on the program pass information PPI for the target memory block when a subsequent program operation is performed on the target memory block.

The update circuit 320 may increase the count value CNT for the target page whenever the program verification result is failure and compare the count value CNT for the target page with the first threshold value TH1 when the program verification result is a pass. When the comparison result indicates that the count value CNT for the target page is less than the first threshold value TH1, the update circuit 320 may compare the count value CNT for the target page with the current maximum count value MCNT for the target memory block and generate the second comparison signal COM2, and the storage circuit 330 may store the maximum count value CNT' for the target memory block as the program pass information PPI for the target memory block in response to the second comparison signal COM2. Accordingly, when the count value CNT for the target page is less than the first threshold value TH1, a larger value between the count value CNT for the target page and the current maximum count value MCNT for the target memory block may be updated as the maximum count value CNT' for the target memory block in the program pass information PPI for the target memory block.

The target memory block may be managed as a bad block based on the program pass information PPI for the target memory block stored in the storage circuit 330. When the maximum count value CNT' for the target memory block in the program pass information PPI for the target memory block is equal to or greater than the second threshold value TH2, the target memory block may be designated as the bad block. In this case, the second threshold value TH2 may be less than the first threshold value TH1 by a predetermined size.

When the comparison result indicates that the count value CNT for the target page is equal to or greater than the first threshold value TH1, the update circuit 320 may generate the first comparison signal COM1. The storage circuit 330 may store the input address ADD of the target memory block including the target page as the program failure information PFI in response to the first comparison signal COM1. The target memory block may be designated as the bad block based on the program failure information PFI stored in the storage circuit 330.

Although it is illustrated that the control logic 250 is included in the same chip as the memory cell array 210, the present disclosure is not limited thereto. For example, the control logic 250 may be implemented as a chip separated from the memory cell array 210, that is, a flash translation layer (FTL) provided to the controller 130.

Figure 4:
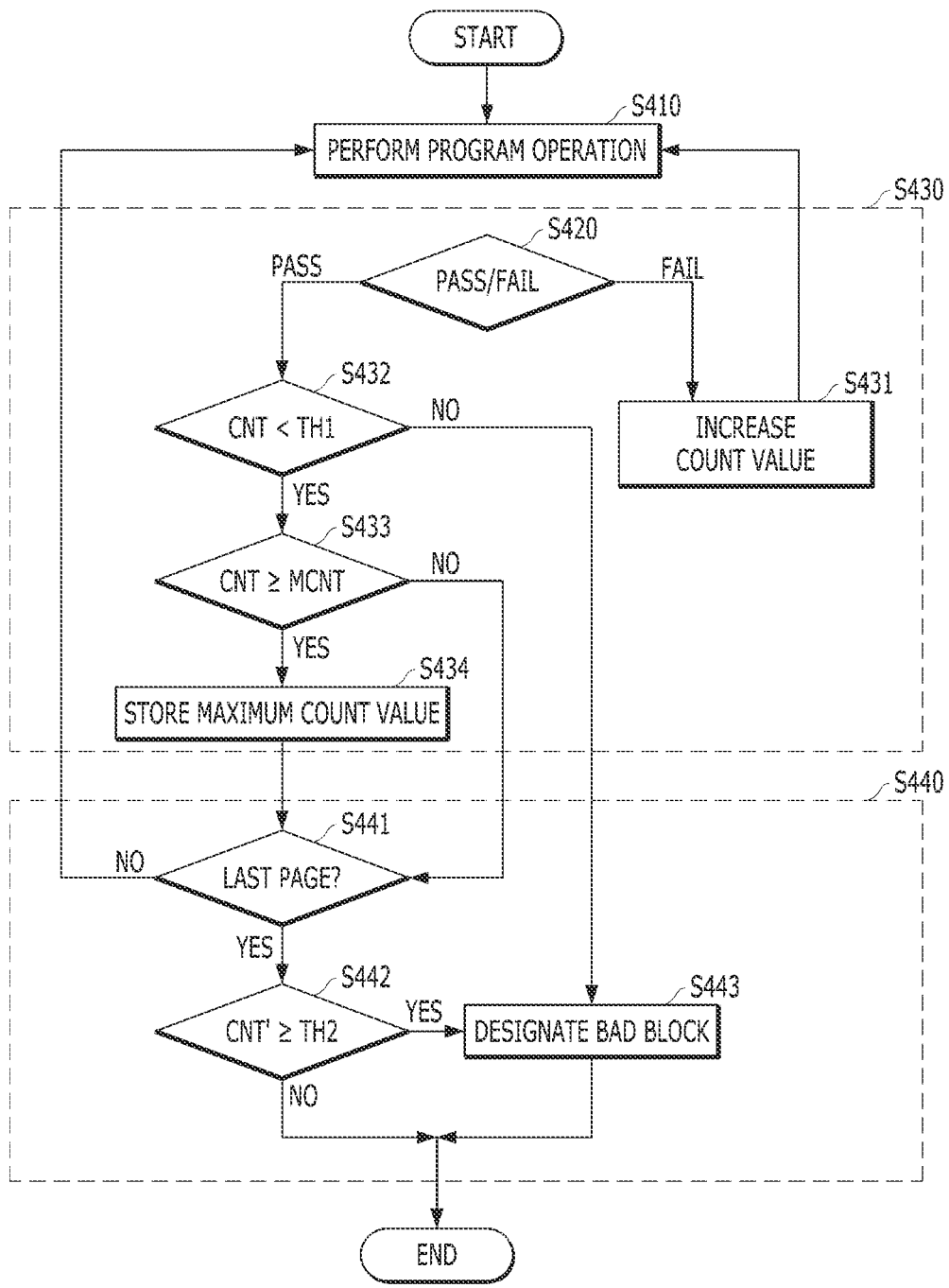
FIG. 4 is a flowchart illustrating an operation of a memory system in accordance with an embodiment of the present disclosure.

FIG. 4 is a flowchart illustrating an operation of the memory system 120 in accordance with an embodiment of the present disclosure.

In operation S410, the memory device 140 may perform a program operation on the target page within the target memory block.

In operation S420, the memory device 140 may perform the verification operation of a program loop on the target page.

In operation S430, the memory device 140 may increase the count value CNT for the target page based on a result of the verification operation of S420, compare the count value CNT for the target page with the current count value MCNT for the target memory block, and update the maximum count value CNT' for the target memory block.

Specifically, when the verification result indicates the program failure (that is, "FAIL" in operation S420), the memory device 140 may perform operation S431. That is, the memory device 140 may increase the count value CNT for the target page in operation S431 and may perform operation S410 for another program loop for the target page based on the increased count value CNT for the target page. On the other hand, when the verification result indicates the program pass (that is, "PASS" in operation S420), the memory device 140 may compare the count value CNT for the target page with the first threshold value TH1 and the current maximum count value MCNT for the target memory block.

In operation S432, the memory device 140 may compare the count value CNT for the target page with the first threshold value TH1. When the comparison result indicates that the count value CNT for the target page is less than the first threshold value TH1 (that is, "YES" in operation S432), the memory device 140 may perform operation S433. That is, the memory device 140 may compare the count value CNT for the target page with the current maximum count value MCNT for the target memory block. On the other hand, when the comparison result indicates that the count value CNT for the target page is equal to or greater than the first threshold value TH1 (that is, "NO" in operation S432), the memory device 140 or the controller 130 may perform operation S443. That is, the target memory block may be designated as a bad block.

In operation S433, when the comparison result indicates that the count value CNT for the target page is equal to or greater than the current maximum count value MCNT for the target memory block (that is, "YES" in operation S433), the memory device 140 may perform operation S434. That is, the memory device 140 may store the count value CNT for the target page as the maximum count value CNT' for the target memory block in operation S434. On the other hand, when the comparison result indicates that the count value CNT for the target page is less than the current maximum count value MCNT for the target memory block (that is, "NO" in operation S433), the memory device 140 may perform operation S441.

In operation S440, the controller 130 and the memory device 140 may manage the target memory block as a bad block based on the updated maximum count value CNT' of the target memory block.

In operation S441, the memory device 140 may check whether a program operation is completed on all pages included in the target memory block. When the check result indicates that the program operation is completed on all pages within the target memory block (that is, "YES" in operation S441), the memory device 140 may provide the controller 130 with the program pass information PPI for the target memory block, and the controller 130 may perform operation S442. On the other hand, when the check result indicates that the program operation is not yet completed on all pages within the target memory block (that is, "NO" in operation S441), the memory device 140 may perform operation S410 on another page within the target memory block.

In operation S442, the controller 130 may compare the updated maximum count value CNT' for the target memory block with the second threshold value TH2. When the comparison result indicates that the updated maximum count value CNT' for the target memory block is equal to or greater than the second threshold value TH2 (that is, "YES" in operation S442), the controller 130 may perform operation S443. That is, the target memory block may be designated as a bad block. In this case, the second threshold value TH2 may be less than the first threshold value TH1 by a predetermined size.

According to an embodiment of the present disclosure, when the number of program loops performed on the target page included in the target memory block is equal to or greater than the first threshold value TH1, the target memory block may be determined as a bad block. Furthermore, when the numbers of program loops on all pages within the target memory block are less than the first threshold value TH1, the number of program loops on each page within the target memory block may be compared with the current maximum number of program loops for the target memory block to update the maximum number of program loops for the target memory block. The updated maximum number of program loops for the target memory block may be compared with the second threshold value TH2 that is less than the first threshold value TH1 by a predetermined size. That is, a memory block, within which numbers of program loops on all pages are less than the first threshold value TH1 but the maximum number of program loops is close to the first threshold value TH1, may be managed as a bad block to prevent program failure.

According to an embodiment of the present disclosure, a memory device may manage the maximum number of program loops for the target memory block during a program operation on each page within the target memory block. A memory system including the memory device may detect, in advance, a memory block having a high probability of occurrence of program failure among the plurality of memory blocks and process the detected memory block as a bad block, thereby preventing the occurrence of program failure.

While the present disclosure has been specifically described with reference to the embodiments, it should be noted that the disclosed embodiments are provided for illustrative purposes, not restrictive purposes. For example, although the disclosed embodiments have described that a controller manages a bad block of a memory device, a plurality of memory blocks may be designated as bad blocks through control logic included in the memory device. Further, those skilled in the art will understand that various embodiments are possible through various substitutions, changes, and modifications without departing from the technical spirit of the present disclosure.

Although various embodiments of the disclosed technology have been described with particular specifics and varying details for illustrative purposes, those skilled in the art will appreciate that various modifications, additions and substitutions may be made without departing from the spirit and scope of the disclosure as defined in the following claims.

What is claimed is:

1. A memory system comprising:
a memory device suitable for:
performing, in stages, a program loop including a program operation and a program verification operation on each page within a memory block selected among a plurality of memory blocks,
updating a maximum number of program loops for the selected memory block by comparing a number of program loops on each page, which are performed until the program verification operation is processed as a pass on the page, with a current maximum number of program loops for the selected memory block, and
storing the updated maximum number of program loops for the selected memory block as program pass information of the selected memory block; and
a controller suitable for managing the selected memory block as a bad block based on the program pass information of the selected memory block.

2. The memory system of claim 1,
wherein the memory device is further suitable for comparing the number of program loops on each page with a first threshold value, and
wherein the memory device updates, as the maximum number of program loops for the selected memory block, a higher number between the number of program loops on each page and the current maximum number of program loops for the selected memory block when the number of program loops on each page is less than the first threshold value.

3. The memory system of claim 2, wherein the controller manages the selected memory block as the bad block by:
comparing the maximum number of program loops for the selected memory block with a second threshold value and
designating the selected memory block as the bad block when the maximum number of program loops for the selected memory block is equal to or greater than the second threshold value.

4. The memory system of claim 3, wherein the second threshold value is less than the first threshold value by a predetermined size.

5. The memory system of claim 2, wherein when the number of program loops on one among the pages within the selected memory block is equal to or greater than the first threshold value, the memory device is further suitable for transmitting an address of the selected memory block, as program failure information, to the controller.

6. The memory system of claim 5, wherein the controller manages the selected memory block as the bad block by designating the selected memory block as the bad block based on the program failure information.

7. The memory system of claim 1, wherein when the program loop is completely performed on all pages included in the selected memory block, the memory device is further suitable for transmitting the program pass information of the selected memory block to the controller.

8. The memory system of claim 1, wherein the program pass information includes an address of the selected memory block and the maximum number of program loops for the selected memory block.

9. A memory system comprising:
a controller;
a memory device comprising:
    at least one memory block including a plurality of pages;
    a check circuit suitable for verifying a program pass or program failure of a page selected among the plurality of pages, and outputting a pass signal and a failure signal;
    an update circuit suitable for updating a maximum count value of the memory block by increasing a count value of the selected page in response to the failure signal and comparing the count value of the selected page with a current maximum count value of the memory block; and
    a storage circuit suitable for storing the updated maximum count value of the memory block as program pass information of the memory block.

10. The memory system of claim 9,
wherein the update circuit is further suitable for comparing the count value of the selected page with a first threshold value, and
wherein the update circuit updates, as the maximum count value of the memory block, a higher value between the count value of the selected page and the current maximum count value of the memory block when the count value of the selected page is less than the first threshold value.

11. The memory system of claim 10, wherein when the updated maximum count value is equal to or greater than a second threshold value that is less than the first threshold value by a predetermined size,
wherein the controller designates the at least one memory block as a bad block.

12. The memory system of claim 10, wherein when the count value is equal to or greater than the first threshold value, the controller designates the at least one memory block as a bad block.

13. The memory system of claim 10, wherein the update circuit includes:
a counter suitable for increasing the count value of the selected page in response to the failure signal;
a first comparator suitable for comparing the count value of the selected page with the first threshold value in response to the pass signal and outputting a first comparison signal; and
a comparator suitable for comparing the count value of the selected page with the current maximum count value of the memory block in response to the pass signal and the first comparison signal and outputting a second comparison signal.

14. The memory system of claim 13, wherein the storage circuit stores an address of the memory block and the count value of the selected page as the program pass information of the memory block in response to the second comparison signal.

15. The memory system of claim 13, wherein the storage circuit stores an address of the memory block as program failure information of the memory block in response to the first comparison signal.

16. An operating method of a memory system, comprising:
programming a page selected among a plurality of pages included in at least one memory block and verifying a program pass or program failure of the selected page;
updating a maximum count value of the memory block by increasing a count value of the selected page based on the verification result and comparing the count value of the selected page with a current maximum count value of the memory block; and
managing the memory block as a bad block based on the updated maximum count value of the memory block.

17. The operating method of claim 16, wherein the updating of the maximum count value includes:
increasing the count value of the selected page when the verification result indicates the program failure;
comparing the count value of the selected page with a first threshold value and the current maximum count value of the memory block when the verification result indicates the program pass; and
storing the count value of the selected page as the maximum count value of the memory block when the comparison result indicates that the count value of the selected page is less than the first threshold value and is equal to or greater than the current maximum count value of the memory block.

18. The operating method of claim 17, wherein the managing of the memory block as the bad block includes:
comparing the updated maximum count value of the memory block with a second threshold value when the plurality of pages are completely programmed; and
designating the memory block as the bad block when the comparison result indicates that the updated maximum count value of the memory block is equal to or greater than the second threshold value.

19. The operating method of claim 18, wherein the second threshold value is less than the first threshold value by a predetermined size.

20. The operating method of claim 18, wherein the managing of the memory block as the bad block further includes designating the memory block as the bad block when the comparison result indicates that the count value of the selected page is equal to or greater than the first threshold value.

* * * * *